United States Patent [19]

Leupold

[11] Patent Number: 5,422,618
[45] Date of Patent: Jun. 6, 1995

[54] TOROIDAL PERMANENT MAGNET SOLENOID

[75] Inventor: Herbert A. Leupold, Eatontown, N.J.

[73] Assignee: The United States of America as represented by the Secretary of the Army, Washington, D.C.

[21] Appl. No.: 281,795

[22] Filed: Jul. 19, 1994

[51] Int. Cl.⁶ .............................................. H01F 7/02
[52] U.S. Cl. .................................................. 335/306
[58] Field of Search .............................. 335/302–306; 315/5.35

[56] References Cited

U.S. PATENT DOCUMENTS

| Re. 33,736 | 11/1991 | Clarke | 335/210 |
|---|---|---|---|
| 4,592,889 | 6/1986 | Leupold et al. | 419/66 |
| 4,731,598 | 3/1988 | Clarke | 335/210 |
| 4,837,542 | 6/1989 | Leupold | 335/306 |
| 4,839,059 | 6/1989 | Leupold | 210/335 |
| 4,911,627 | 3/1990 | Leupold | 425/3 |
| 5,063,004 | 11/1991 | Leupold | 264/22 |
| 5,216,400 | 6/1993 | Leupold | 335/306 |
| 5,216,401 | 6/1993 | Leupold | 335/306 |

OTHER PUBLICATIONS

H. A. Leupold et al., A Catalogue Of Novel Permanent-Magnet Field Sources, 9th International Workshop on Rare-Earth Magnets and Their Applications, Bad Soden, Paper No. W3.2, FRG, Aug. 31–Sep. 2, 1987, (pp. 109–123).
H. A. Leupold et al., Novel High-Field Permanent-Magnet Flux Sources, IEEE Transactions On Magnetics, vol. MAG-23, No. 5, Sep. 1987, (pp. 3628–3629).
H. A. Leupold et al., Bulk Reduction And Field Enhancement In Periodic Permanent-Magnetic Structures, IEEE Transactions On Electron Devices, vol. ED-34, No. 8, Aug. 1987, (pp. 1868–1872).

*Primary Examiner*—Leo P. Picard
*Assistant Examiner*—Raymond M. Barrera
*Attorney, Agent, or Firm*—Michael Zelenka; George B. Tereschuk

[57] ABSTRACT

A permanent magnet solenoid structure utilizes a hollow, tubular, toroidally-shaped flux source, an interior working space, a magnetizing member having an end magnet and two pole pieces. The magnetizing member intersects the flux source and the interior working space with the desired magnetic field being confined to the interior working space of the toroid by having a cladding magnet in contact with the outer surface of the toroidal supply magnet. In another embodiment, the interior working space is an annular ring rather than being toroidally-shaped. In yet another embodiment, the interior working space is an annular ring and an aperture or tunnel is provided through the magnetizing member so that electron particles can be electrostatically or thermally created, accelerated around the interior working space and then collected at a certain point within the interior working space.

13 Claims, 4 Drawing Sheets

TOROIDAL PERMANENT MAGNET SOLENOID

GOVERNMENT INTEREST

The invention described herein may be manufactured, used and licensed by or for the Government of the United States of America without the payment to me of any royalties thereon.

RELATED APPLICATIONS

The following co-pending U.S. patent applications of mine, which have been assigned to the same assignee, are related to this application and are incorporated herein by reference: U.S. Ser. No. 650,845, filed Feb. 5, 1991, entitled "High-Power Machinery with Toroidal Permanent Magnets;" U.S. Ser. No. 654,476, filed Feb. 13, 1991, entitled "High-Power Electrical Machinery" and U.S. Ser. No. 709,548, filed Jun. 3, 1991, entitled "High-Field Permanent Magnet Flux Source."

BACKGROUND OF THE INVENTION

1. Field of the Invention

This invention relates to permanent magnet devices. More particularly, this invention relates to a device for producing a toroidal, solenoidal magnetic field confined to a toroid.

2. Description of the Prior Art

Many devices that employ magnetic fields have heretofore been encumbered by massive solenoids with their equally bulky power supplies. Thus, there has been increasing interest in the application of permanent-magnet structures for uses such as electron-beam focusing and biasing fields. Solenoids are common and have many practical and useful electrical and electronic applications as they furnish longitudinal magnetic fields for laboratory measurements, dc field biasing, particle beam focusing and so on. Solenoids are employed in devices such as extended interaction amplifiers, klystrons, travelling wave tubes, and magnetrons. Typically, solenoids are made of a long wire wound in a close packed helix forming a cylindrical tube.

The current demand for compact, strong, static magnetic field sources that require no electric power supplies has created needs for permanent magnet structures of unusual form. There has been increasing interest in applications using permanent magnet structures. A number of configurations have been designed and developed for electron beam guidance in mm/microwave tubes of various types: for dc biasing fields in millimeter wave filters, circulators, isolators, strip-lines; for field sources in NMR (nuclear magnetic resonance) imagers; and so on. In recent years, it has been possible to furnish a structure, shown in FIG. 1, made of permanent magnets rather than the variety of cumbersome electric current solenoids with their dependence on equally bulky power sources.

Likewise, radially-oriented toroidal magnets are well known in the permanent magnet art. Problems with fabricating radially-oriented toroidal magnets have also been overcome. See for example, the patent to Leupold, U.S. Pat. No. 4,592,889, entitled "Method and Apparatus For the Pressing and Alignment of Radially Oriented Toroidal Magnets," Leupold, U.S. Pat. No. 4,911,627, entitled "Apparatus for Fabrication of Permanent Magnet Toroidal Rings" and Leupold, U.S. Pat. No. 5,063,004, entitled "Fabrication of Permanent Magnet Toroidal Rings". The structure disclosed and claimed herein features a magnetic field confined within a toroid parallel to the longitudinal axis of the tubular working space, rather than in a radially-oriented toroidal magnet disclosed in those inventions. Similarly, Clarke, reissued U.S. Pat. No. 33,736 and the underlying U.S. Pat. No. 4,731,598, entitled "Periodic Permanent Magnet Structure With Increased Useful Field" disclose stacking a plurality of toroidal magnets in a device for focusing a charged particle beam along a beam path.

Toroidal solenoids of the electrical current type are still being fabricated and used. The main disadvantage of electrical solenoids is the need for a cumbersome and equally bulky power supply, which has been long recognized.

Those concerned with the development of solenoids have long recognized the need for a solenoid of the permanent magnet type, i.e. a solenoid that does not require electrical current. The present invention fulfills this need by providing a longitudinal, toroidal magnetic field without electrical currents.

Examples of high-intensity, compact permanent magnets may be found in the following references:

Leupold, U.S. Pat. No. 5,216,400, entitled "Magnetic Field Sources for Producing High-Intensity Variable Fields";

Leupold, U.S. Pat. No. 5,216,401, entitled "Magnetic Field Sources Having Non-Distorting Access Ports";

Leupold, U.S. Pat. No. 4,837,542, entitled "Hollow Substantially Hemispherical Permanent Magnet High-Field Flux Source for Producing a Uniform High Field"; and Leupold, U.S. Pat. No. 4,839,059, entitled "Clad Magic Ring Wigglers".

Additionally, magnets of the type described herein may be found in the following references:

Leupold et. al., "Bulk Reduction and Field Enhancement in Periodic Permanent-Magnet Structures," *IEEE Transactions On Electron Devices*, Vol. ED-34, No. 8, Aug. 1987;

Leupold et. al., "Novel High-Field Permanent Magnet Flux Sources," *IEEE Transactions On Magnetics*, vol. MAG-23, No. 5, pp. 3628–3629, September 1987; and Leupold et. al., "A Catalogue of Novel Permanent-Magnet Flux Sources," *Paper No. W3.2 9th International Workshop on Rare Earth Magnets And Their Applications*, pp. 109–123, August 1987, Bad Soden, Federal Republic of Germany.

Further, magnets that provide uniform magnetic fields may be found in my co-pending U.S. patent applications that are incorporated herein by reference:

U.S. Ser. No. 650,845, filed Feb. 5, 1991, entitled "High-Power Machinery with Toroidal Permanent Magnets;"

U.S. Ser. No. 654,476, filed Feb. 13, 1991, entitled "High-Power Electrical Machinery" and;

U.S. Ser. No. 709,548, filed Jun. 3, 1991, entitled "High-Field Permanent Magnet Flux Source."

SUMMARY OF THE INVENTION

It is an object of this invention to provide a toroidal solenoid of the permanent magnet kind.

It is a further object of this invention to provide a toroidal solenoid of the permanent magnet kind where the desired magnetic field is confined to the interior working space of the toroid by having a cladding magnet in contact with the outer surface of the toroidal supply magnet. Another object of this invention is to provide a toroidal solenoid of the permanent magnet kind where the interior working space is an annular ring. It is a still further object of this invention to provide a toroidal solenoid of the permanent magnet kind with an aperture within the end magnet and pole pieces.

To attain these objects, the present invention contemplates a permanent magnet solenoid structure having a unique toroidally-shaped flux source, an interior working space, a magnetizing member having an end magnet and two (2) iron pole pieces and a cladding magnet to confine the magnetic flux within the interior working space. More specifically, the present invention is directed to a solenoid of the permanent magnet kind with a structure comprising a hollow, tubular, toroidally-shaped flux source, an enclosed interior working space, a magnetizing member comprising two (2) iron pole pieces and an end magnet and a cladding magnet contacting the toroidally-shaped flux source in order to confine the magnetic flux to the interior working space that possesses all the advantages of permanent magnets yet possesses none of the aforedescribed disadvantages of electrical solenoids and toroidal electrical solenoids.

The toroidal solenoid permanent magnet of the present invention can be used in plasma physics, magnetic plasma confinement and particle accelerator and gyroradiation sources. Also, due to the construction of the device of this invention, the magnetic field can be confined to the toroid.

In general, the present invention is a hollow, tubular, toroidal supply magnet acting as a magnetic flux source that encloses an interior working space. A magnetizing member having two (2) iron pole pieces and an end magnet, intersects both the toroidally-shaped flux source and the interior working space. The magnetization orientations of the flux source, the cladding magnet and the end magnet are indicated by the small arrows on FIG. 2. The toroidally-shaped flux source magnet forces magnetic flux into the working space through one pole piece and extracts the magnetic flux through the other pole piece, while the cladding magnet confines the magnetic flux to the interior working space.

In the preferred embodiment, the invention is a hollow, tubular, toroidal supply magnet acting as a magnetic flux source that encloses an interior working space. A magnetizing member having two (2) iron pole pieces sandwiching an end magnet intersects the toroidally-shaped flux source and the interior working space along an imaginary line drawn from the concentric axes of the toroidally-shaped flux source and the interior working space to the outer surface of the flux source. The magnetization orientations of the flux source, the cladding magnet and the end magnet are indicated by the small arrows on FIG. #2. The toroidally-shaped flux source forces the magnetic flux into the enclosed working space through an input pole piece and then extracts the magnetic flux through an output pole piece. The cladding magnet in contact with the outer surface of the flux source serves to confine the magnetic flux within the interior working space.

In one specific embodiment, the invention is an interior working space comprising an annular ring instead of a toroid, where the inside and outer walls of the interior working space are cylindrical with concentric axes. In this embodiment, electrons may be collected at a certain point D within the interior working space.

In another embodiment of this invention, an aperture is provided through the parts of the magnetizing member thereby allowing multiple circuits of an electron beam to experience a reversal of field direction upon entry into, and exit from, the magnet of the magnetizing member.

The term "toroidally-shaped" as used throughout this specification should be considered to refer to a surface generated by the revolution of a circle, rectangle, or a contour of any shape about an axis lying on its plane. Also, the terms "conically tapered shape" and "toroidal cone" as used throughout this specification should be considered to refer to:

a solid generated by rotating a right triangle about one of its legs; or a solid bounded by a circular or other closed plane base and the surface formed by line segments joining every point of the boundary of the base to the common vertex.

These definitions should apply in conjunction with any other commonly accepted definitions of those terms.

The exact nature of this invention as well as other objects and advantages thereof will be readily apparent from consideration of the following specification relating to the annexed drawings.

DETAILED DESCRIPTION OF THE PREFERRED EMBODIMENT

Figure 1:
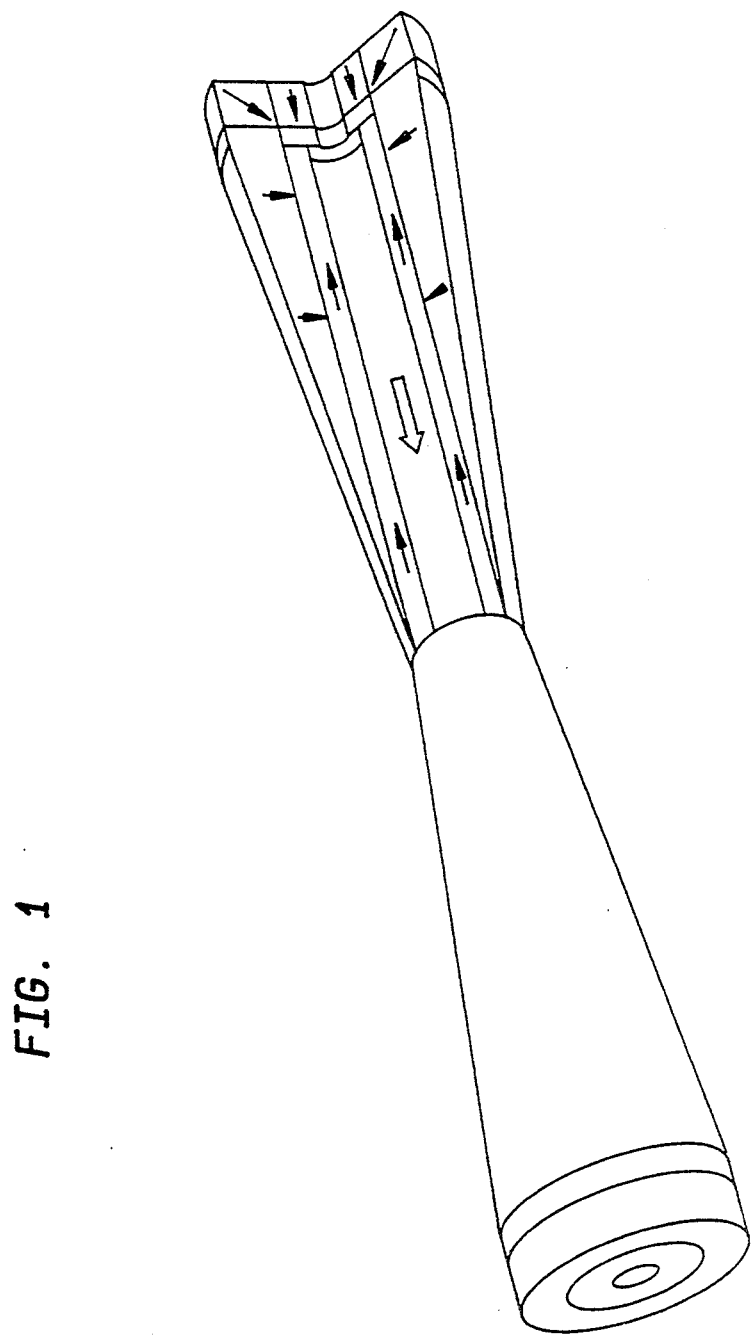
FIG. 1 is a top view with portions broken away of prior art permanent magnet solenoid.
Figure 2:
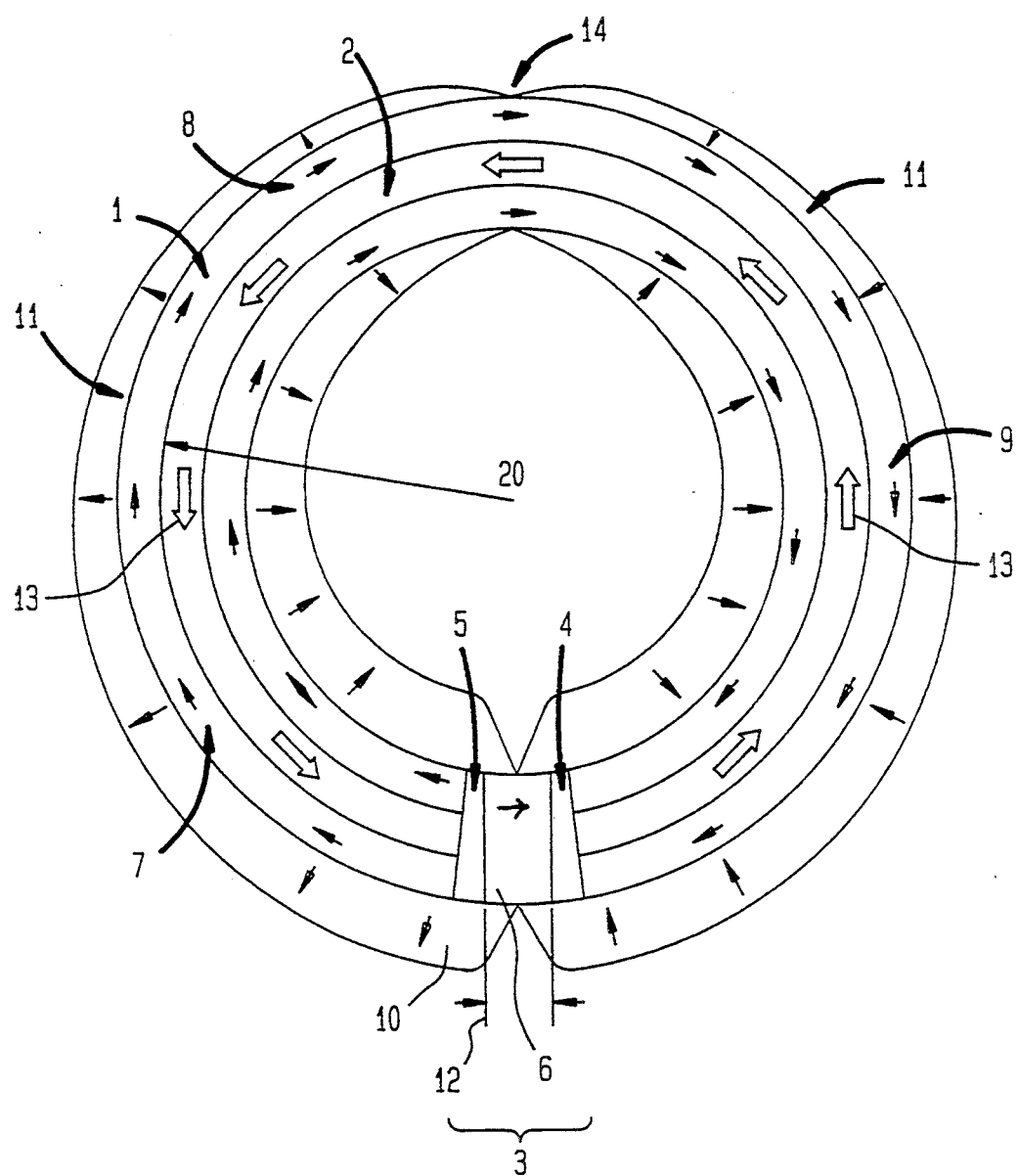
FIG. 2 is a cross-sectional view of a preferred embodiment of the invention.

Referring now to the drawings, there is shown in FIG. 2 a hollow, tubular, toroidal flux source 1 producing a magnetic flux, which encloses an interior working space 2. A magnetizing member 3, having two (2) iron pole pieces 4 and 5, respectively that sandwich an end magnet 6, intersects both the toroidally-shaped flux source 1 and the interior working space 2 along a line drawn from the concentric axes of the flux source 1 and the working space 2 to the outer surface of the flux source 1. The magnetization orientation of the toroidally-shaped flux source 1 and the end magnet 6 of the magnetizing member are indicated by the small arrows numbered 7, 8, and 9 for the toroidally-shaped flux source 1 and 10 for the end magnet 6 on FIG. #2. The toroidally-shaped flux source 1 forces the magnetic flux into the enclosed interior working space 2 through the input pole piece 4 and extracts the magnetic flux through the output pole piece 5. A contoured cladding magnet 11 serves to confine the magnetic flux to the enclosed interior working space 2.

The pole pieces 4 and 5 of the magnetizing member 3 may be constructed of iron or other passive ferromagnetic material, but in either case need to be dimensioned to sandwich the end magnet 6.

The magnetizing member will have the end magnet (6) interposed between the two (2) pole pieces. Further, the magnetic flux is forced into the input pole piece 4, while the magnetic flux is extracted from the output pole piece 5.

The end magnet 6 may be disc shaped or shaped differently so long as the end magnet 6 spans the ends of the toroidally-shaped flux source 1. The end magnet 6 has a thickness $t_E$ 12 which can be determined in the mathematical expressions and formulae discussed below. The end magnet 6 serves to maintain the proper difference of magnetic scalar potential between the pole pieces 4 and 5, respectively.

The outer diameter of the toroidally-shaped flux source 1 is determined by the well-known conservation of flux condition formula holding that flux through supply magnet $\Phi_m$ equals flux in the working space $\Phi_w$ so that: $\Phi_w = A_w H_w = B_m A_m$ where $A_w$ and $A_m$ are cross sectional areas of W and $M_s$, respectively, and $H_w$ is the desired field as represented by the large arrows 13 in FIG. 2 and $B_m$ is the flux density of the magnet. $B_m$ is found from the equation relating the fields in a rigid permanent magnet as follows:

$$B_m = -H_m + B_r$$

where $B_r$ is the magnetic remanence and $H_m$ is the field in the magnet which by Ampere's Law is equal to $H_w$. Based on these expressions, $A_m$ can be determined and then from $A_m$, one can determine rm 20 as the outer radius of $A_m$.

The cladding magnet 11 must be contoured in a conically tapered shape similar to a toroidal cone in order to keep the magnetic flux confined to the interior working space 2. In all embodiments, the cladding magnet 11 is shaped and dimensioned according to the mathematical formula set forth below so that the entire toroidally-shaped flux source 1 is enveloped by the cladding magnet 11.

The cladding magnet 11 is most efficient when the point of zero magnetic potential Pmin 14 is taken to be opposite of end magnet 6 on the major toroidal diameter.

The maximum thickness of the cladding $T_c$ is given by the following formula:

$$\frac{Hw [Cw - (t_p + t_E)]}{Hc} = t_c$$

where Cm is the major circumference of the toroid and $t_p$ and $t_E$ are the combined pole thickness and the thickness of the end magnet 6, respectively. Further, to make every point on the exterior surface of cladding magnet 11 to have equal potential, then $t_c$ must equal $$\frac{t_E}{2}.$$

Figure 3:
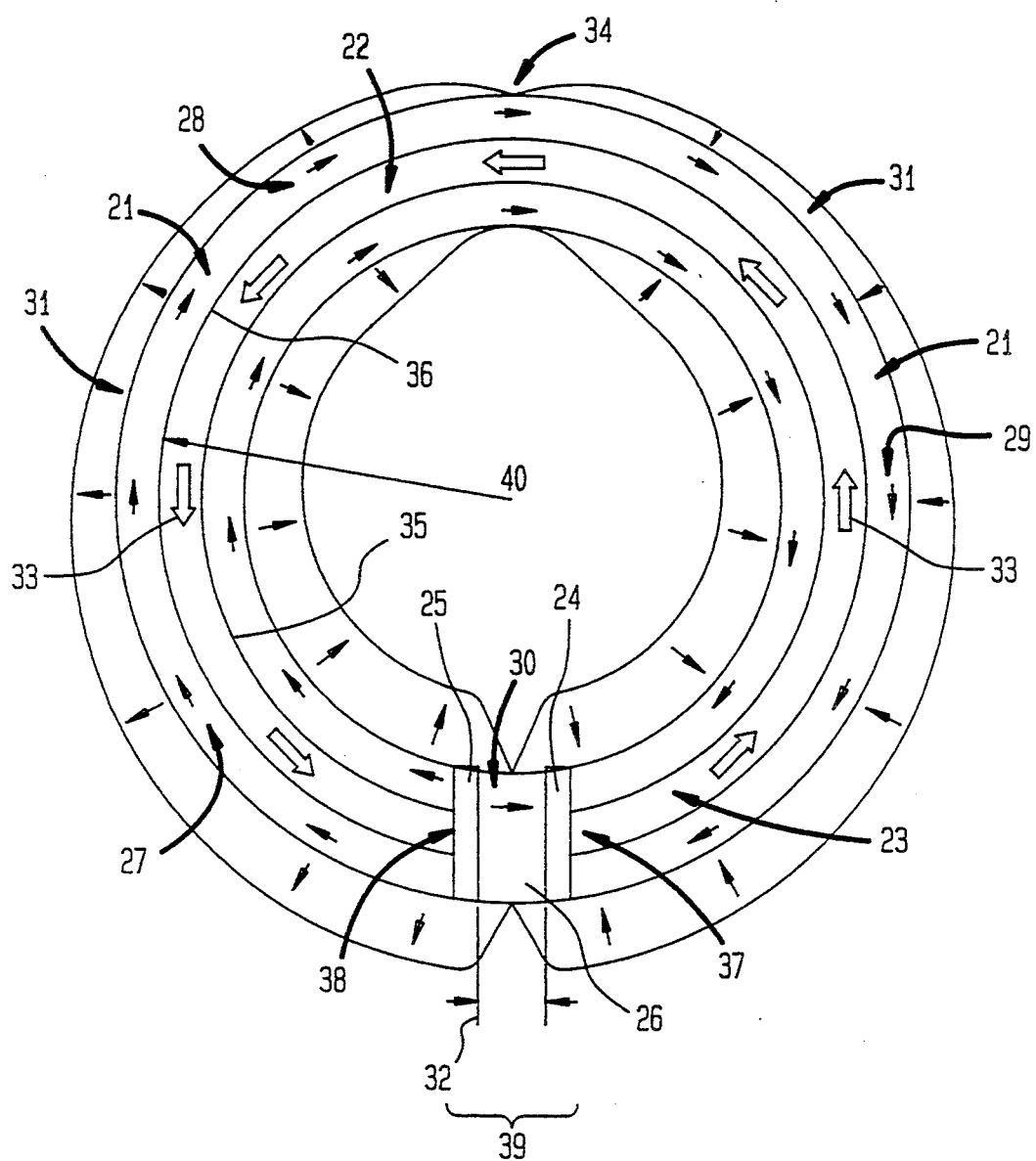
FIG. 3 is a cross-sectional view of another embodiment the invention.

In another embodiment of this invention, instead of having an interior working space toroidally shaped, the interior working space 22 is an annular ring. In this embodiment, the inside 35 and outside walls 36 of the working space 22 are cylindrical with concentric axes, rather than a single toroid wall. This embodiment is depicted in FIG. 3. As an example of this embodiment, a stream of electron particles could be electrostatically or thermally created at Point D 37 within the interior working space 22 and then accelerated around the inside wall 35 of the interior working space 22 by an electron gun so that the electron stream is guided in a circular path and then collected by a strip of copper or an electrode at Point E 38.

Figure 4:
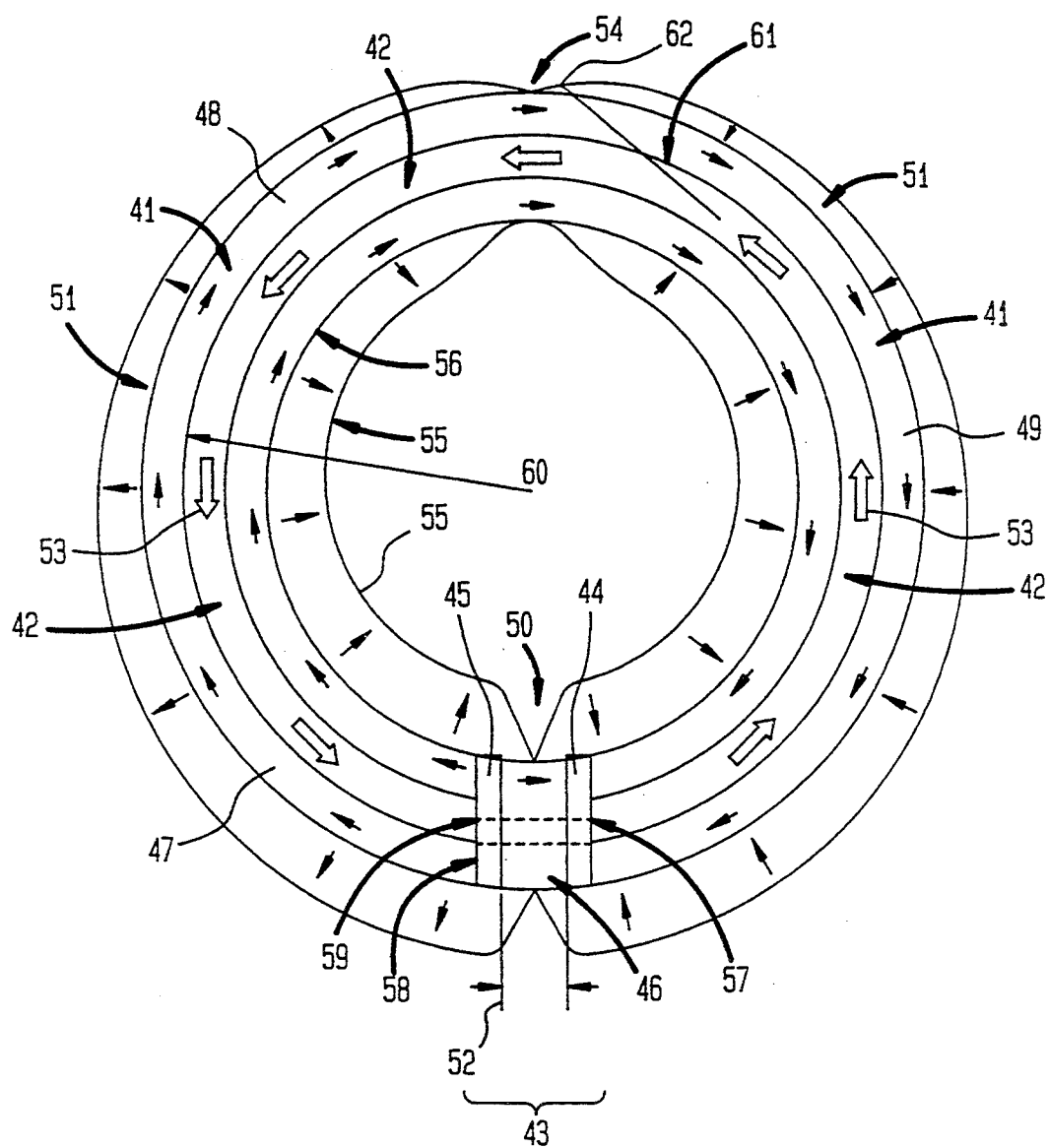
FIG. 4 is a cross-sectional view of another embodiment of the invention.
Figure 2:
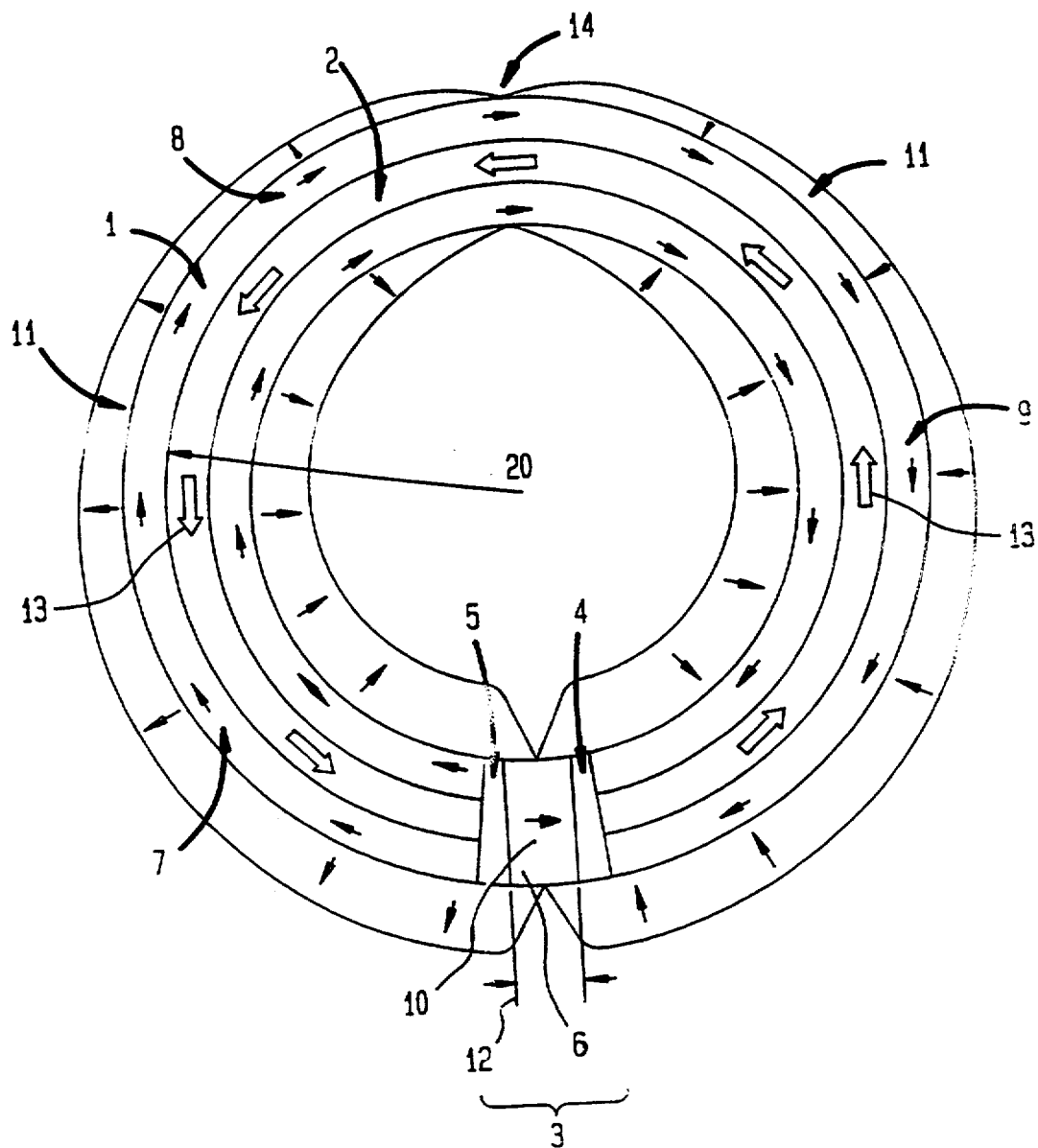

In yet another embodiment, an aperture 59 is provided through the magnetizing member 43 substantially parallel to the outer surface of the toroidally-shaped flux source 41 allowing multiple circuits of an electron beam. This embodiment is depicted in FIG. 4. The electron beam experiences a reversal of field direction upon entry into, and exit from, the end magnet 46. Since under these circumstances, the magnetic field focuses equally well in either direction, for many applications the reversal of field direction would not be important. For the single circuit mode an electron gun could be placed at point D 37 of FIG. 3 and the beam would be picked up at Point E 38 of FIG. 3. However, for multiple circuits the gun could not be placed at Point D 57 of FIG. 4 because the gun would be in the way of the electron beam as the electron beam begins its second circuit. Therefore for multiple circuits, the electron beam needs to be injected from the outside via a tunnel 61. Such a passage would be least disruptive to the field if its opening 62 is formed where the toroid structure is thinnest and the least material needs to be removed.

Although the various embodiments of the present invention show toroidally-shaped magnets and working spaces, other geometries which exhibit like properties are possible. For example, the toroid could be a square cross section with a square end magnet and exhibit the same properties.

It should be understood, of course, that the foregoing disclosure relates only to a small number of preferred embodiments and that numerous modifications or alterations may be made therein without departing from the spirit and scope of the inventions as set forth in the appended claims.

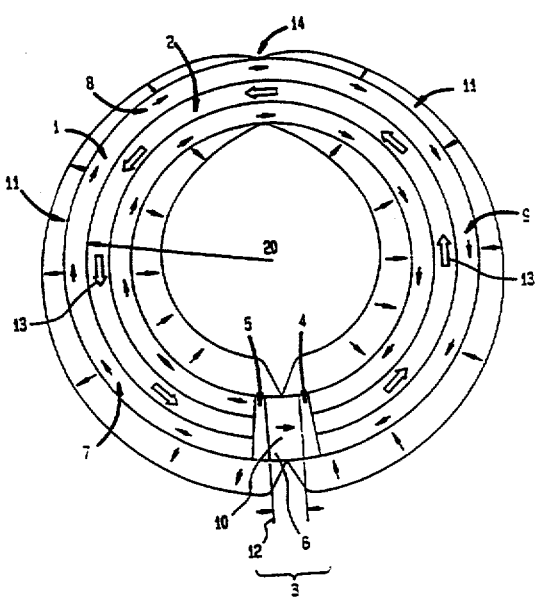

What is claimed is:

1. A permanent magnet solenoid structure, which comprises:
   (a) a hollow, tubular, toroidally-shaped flux source producing a magnetic flux;
   (b) said flux source having a longitudinal axis, an inner surface, an interior working space and an outer surface;
   (c) said interior working space having a longitudinal axis and being enclosed by said flux source;
   (d) a magnetizing member having an input pole piece and an output pole piece, an end magnet, said end magnet being interposed between said pole pieces, said pole pieces being made of iron and dimensioned to sandwich said end magnet;
   (e) said magnetizing member intersecting both said flux source and said interior working space along a line drawn from the concentric axes of said flux source and said interior working space to said outer surface of the flux source;
   (f) said flux source having a clockwise magnetization orientation through said flux source and said magnetizing member having a counterclockwise magnetization orientation;
   (g) a cladding magnet, being dimensioned to surround said flux source, having an inner surface and an exterior surface, said inner surface of the cladding magnet being in contact with said outer surface of said flux source, and said exterior surface being outwardly conically tapered;
   (h) said flux source forcing said magnetic flux into said interior working space through said input pole piece and extracting said magnetic flux through said output pole piece; and
   (i) said exterior surface of the cladding magnet being contoured to confine said magnetic flux within said interior working space.

2. A permanent magnet solenoid structure as recited in claim 1, which comprises:

(a) said end magnet having a thickness $t_E$;

(b) said end magnet serving to maintain the proper difference of magnetic scalar potential between said pole pieces; and (c) said cladding magnet having a point of zero magnetic potential Pmin.

3. A permanent magnet solenoid structure, as recited in claim 2, further comprising said end magnet being disc shaped.

4. A permanent magnet solenoid structure as recited in claim 3, further comprising said pole pieces being made of a passive ferromagnetic material.

5. A permanent magnet solenoid structure, which comprises:

(a) a hollow, tubular, toroidally-shaped flux source producing a magnetic flux;

(b) said flux source, having a longitudinal axis, an inner surface, an interior working space and an outer surface;

(c) said interior working space being in the shape of an annular ring, having a longitudinal axis, a cylindrical inside wall and a cylindrical outer wall, said interior working space being enclosed by said flux source;

(d) said cylindrical inside and outer walls of the interior working space having concentric axes;

(e) a magnetizing member, having an input pole piece, an output pole piece, an end magnet, said end magnet being interposed between said pole pieces, said pole pieces being made of iron and dimensioned to sandwich said end magnet;

(f) said magnetizing member intersecting both said flux source and said interior working space along a line drawn from the concentric axes of said flux source and said interior working space to said outer surface of the flux source;

(g) said flux source having a clockwise magnetization orientation through said flux source and said magnetizing member having a counterclockwise magnetization orientation;

(h) a cladding magnet, being dimensioned to surround said flux source, having an inner surface and an exterior surface, said inner surface of the cladding magnet being in contact with said outer surface of said flux source, and said exterior surface being outwardly conically tapered;

(i) said flux source forcing said magnetic flux into said interior working space through said input pole piece and extracting said magnetic flux through said output pole piece; and (j) said exterior surface of the cladding magnet being contoured to confine said magnetic flux within said interior working space.

6. A permanent magnet solenoid structure as recited in claim 5, which comprises:

(a) said end magnet having a thickness $t_E$;

(b) said end magnet serving to maintain the proper difference of magnetic scalar potential between said pole pieces; and (c) said cladding magnet having a point of zero magnetic potential Pmin.

7. A permanent magnet solenoid structure, as recited in claim 6, further comprising said end magnet being disc shaped.

8. A permanent magnet solenoid structure as recited in claim 7, further comprising said pole pieces being made of a passive ferromagnetic material.

9. A permanent magnet solenoid structure, which comprises:

(a) a hollow, tubular, toroidally-shaped flux source producing a magnetic flux;

(b) said flux source having a longitudinal axis, an inner surface, an interior working space and an outer surface;

(c) said interior working space being in the shape of an annular ring, having a longitudinal axis, a cylindrical inside wall and a cylindrical outer wall, said interior working space being enclosed by said flux source;

(d) said cylindrical inside and outer walls of the interior working space having concentric axes;

(e) a magnetizing member, having an input pole piece and an output pole piece, an end magnet, an aperture being provided through said magnetizing member, said end magnet being interposed between said pole pieces, said pole pieces being made of iron and dimensioned to sandwich said end magnet;

(f) said magnetizing member intersecting both said flux source and said interior working space along a line drawn from the concentric axes of said flux source and said interior working space to the outer surface of said flux source;

(g) said flux source having a clockwise magnetization orientation through said flux source and said magnetizing member having a counterclockwise magnetization orientation;

(h) a cladding magnet, being dimensioned to surround said flux source, having an inner surface and an exterior surface, said inner surface of the cladding magnet being in contact with said outer surface of said flux source, and said exterior surface being outwardly conically tapered;

(i) said aperture being provided through said magnetizing member substantially parallel to said outer surface face of the flux source;

(j) said flux source forcing said magnetic flux into said interior working space through said input pole piece and extracting said magnetic flux through said output pole piece; and (k) said exterior surface of the cladding magnet being contoured to confine said magnetic flux within said interior working space.

10. A permanent magnet solenoid structure as recited in claim 9, which comprises:

(a) said end magnet having a thickness $t_E$;

(b) said end magnet serving to maintain the proper difference of magnetic scalar potential between said pole pieces; and (c) said cladding magnet having a point of zero magnetic potential Pmin.

11. A permanent magnet solenoid structure as recited in claim 10, further comprising said end magnet being disc shaped.

12. A permanent magnet solenoid structure as recited in claim 11, further comprising said pole pieces being made of a passive ferromagnetic material.

13. A permanent magnet solenoid structure as recited in claim 12, further comprising a tunnel having an opening on said exterior surface of the cladding magnet and an ending point within said flux source.

* * * * *

UNITED STATES PATENT AND TRADEMARK OFFICE
CERTIFICATE OF CORRECTION

PATENT NO. : 5,422,618
DATED : June 6, 1995
INVENTOR(S) : Herbert A. Leupold

It is certified that error appears in the above-identified patent and that said Letters Patent is hereby corrected as shown below:

The title page, should be deleted to appear as per attached title page.

The sheet of drawing consisting of figure 2, should be deleted to appear as per attached figure 2.

Signed and Sealed this

Sixteenth Day of April, 1996

Attest:

BRUCE LEHMAN

Attesting Officer    Commissioner of Patents and Trademarks

United States Patent [19]

Leupold

[11] Patent Number: 5,422,618

[45] Date of Patent: Jun. 6, 1995

[54] TOROIDAL PERMANENT MAGNET SOLENOID

[75] Inventor: Herbert A. Leupold, Eatontown, N.J.

[73] Assignee: The United States of America as represented by the Secretary of the Army, Washington, D.C.

[21] Appl. No.: 281,795

[22] Filed: Jul. 19, 1994

[51] Int. Cl.⁶ .............................................. H01F 7/02
[52] U.S. Cl. .............................................. 335/306
[58] Field of Search .................... 335/302–306; 315/5.35

[56] References Cited

U.S. PATENT DOCUMENTS

| Re. 33,736 | 11/1991 | Clarke | 335/210 |
|---|---|---|---|
| 4,592,889 | 6/1986 | Leupold et al. | 419/66 |
| 4,731,598 | 3/1988 | Clarke | 335/210 |
| 4,837,542 | 6/1989 | Leupold | 335/306 |
| 4,839,059 | 6/1989 | Leupold | 210/335 |
| 4,911,627 | 3/1990 | Leupold | 425/3 |
| 5,063,004 | 11/1991 | Leupold | 264/22 |
| 5,216,400 | 6/1993 | Leupold | 335/306 |
| 5,216,401 | 6/1993 | Leupold | 335/306 |

OTHER PUBLICATIONS

H. A. Leupold et al., A Catalogue Of Novel Permanent-Magnet Field Sources, 9th International Workshop on Rare-Earth Magnets and Their Applications, Bad Soden, Paper No. W3.2, FRG, Aug. 31–Sep. 2, 1987, (pp. 109–123).
H. A. Leupold et al., Novel High-Field Permanent-Magnet Flux Sources, IEEE Transactions On Magnetics, vol. MAG-23, No. 5, Sep. 1987, (pp. 3628–3629).
H. A. Leupold et al., Bulk Reduction And Field Enhancement In Periodic Permanent-Magnetic Structures, IEEE Transactions On Electron Devices, vol. ED-34, No. 8, Aug. 1987, (pp. 1868–1872).

*Primary Examiner*—Leo P. Picard
*Assistant Examiner*—Raymond M. Barrera
*Attorney, Agent, or Firm*—Michael Zelenka; George B. Tereschuk

[57] ABSTRACT

A permanent magnet solenoid structure utilizes a hollow, tubular, toroidally-shaped flux source, an interior working space, a magnetizing member having an end magnet and two pole pieces. The magnetizing member intersects the flux source and the interior working space with the desired magnetic field being confined to the interior working space of the toroid by having a cladding magnet in contact with the outer surface of the toroidal supply magnet. In another embodiment, the interior working space is an annular ring rather than being toroidally-shaped. In yet another embodiment, the interior working space is an annular ring and an aperture or tunnel is provided through the magnetizing member so that electron particles can be electrostatically or thermally created, accelerated around the interior working space and then collected at a certain point within the interior working space.

13 Claims, 4 Drawing Sheets